United States Patent
Davis et al.

(10) Patent No.: US 10,681,837 B1
(45) Date of Patent: Jun. 9, 2020

(54) SPACECUBE V2.0 FLIGHT CARD MECHANICAL SYSTEM

(71) Applicant: United States of America as represented by the Administrator of NASA, Washington, DC (US)

(72) Inventors: Milton C. Davis, Upper Marlboro, MD (US); David J. Petrick, Severna Park, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 0 days.

(21) Appl. No.: 16/145,802

(22) Filed: Sep. 28, 2018

Related U.S. Application Data

(60) Provisional application No. 62/567,506, filed on Oct. 3, 2017.

(51) Int. Cl.
  *H02B 1/01* (2006.01)
  *H05K 7/18* (2006.01)
  *H05K 5/02* (2006.01)
  *B64G 1/66* (2006.01)

(52) U.S. Cl.
  CPC ............... *H05K 7/18* (2013.01); *B64G 1/66* (2013.01); *H05K 5/0204* (2013.01)

(58) Field of Classification Search
  USPC ........................................ 361/829
  See application file for complete search history.

(56) References Cited

U.S. PATENT DOCUMENTS

| | | | |
|---|---|---|---|
| 4,837,664 A * | 6/1989 | Rodriguez, II | H05K 7/1461 165/185 |
| 4,916,575 A * | 4/1990 | Van Asten | H05K 7/20545 165/185 |
| 5,208,732 A * | 5/1993 | Baudouin | G06K 19/077 257/713 |
| 6,839,235 B2 * | 1/2005 | St. Louis | H05K 7/20672 165/104.33 |
| 7,324,348 B2 * | 1/2008 | Berg, Jr. | H04Q 1/10 361/752 |
| 9,370,090 B2 * | 6/2016 | Chauhan | H05K 7/1461 |

* cited by examiner

Primary Examiner — Hung S. Bui
(74) Attorney, Agent, or Firm — Heather Goo; Bryan A. Geurts

(57) ABSTRACT

An electronic assembly support system includes a frame having a plurality of side rails side rails to be positioned along a longitudinal axis of an electronic assembly, a plurality of cross rails connected between the side rails, positioned to surround predetermined components of the electronic assembly, and a first fastener interface for attaching the plurality of side rails and cross rails to the electronic assembly.

18 Claims, 7 Drawing Sheets

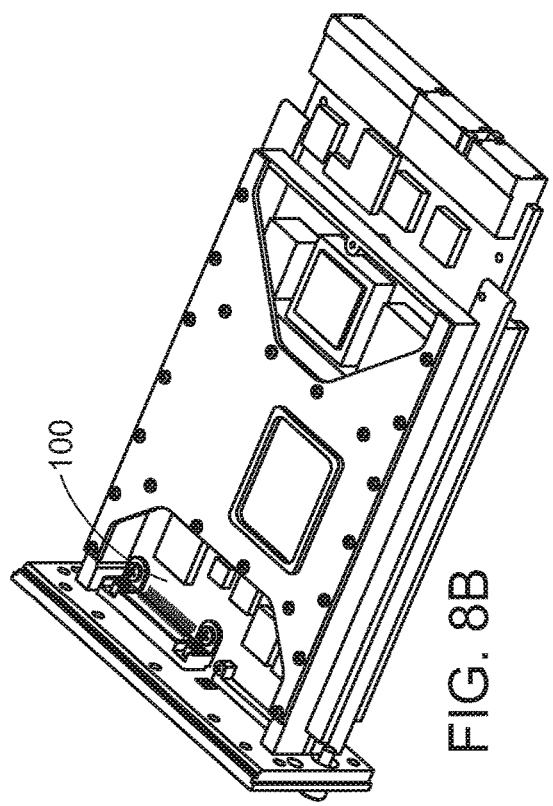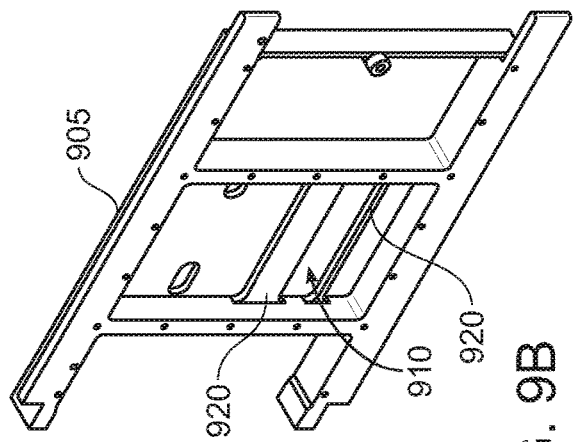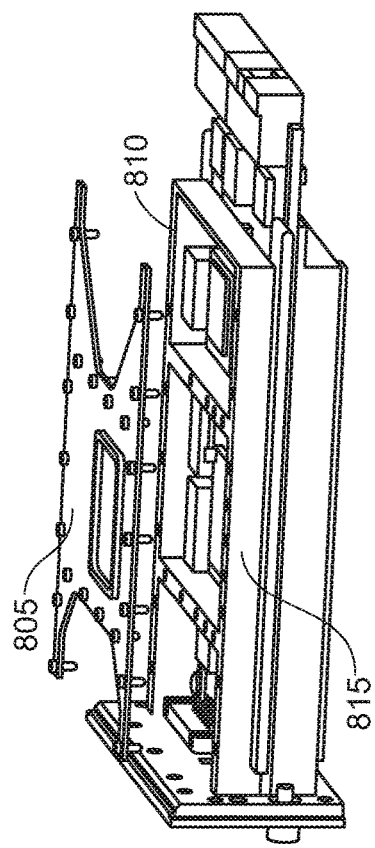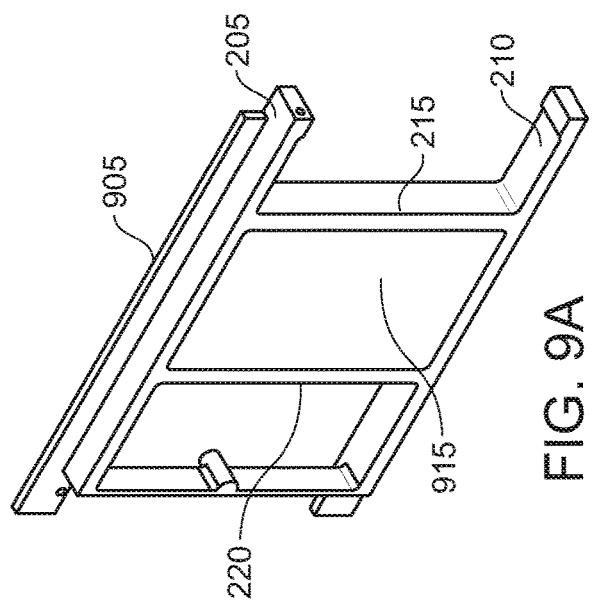

SPACECUBE V2.0 FLIGHT CARD MECHANICAL SYSTEM

CROSS-REFERENCE TO RELATED APPLICATIONS

This application claims priority to U.S. Provisional Application No. 62/567,506, filed Oct. 3, 2017. The contents of the foregoing are hereby incorporated by reference into this application as if set forth herein in full.

ORIGIN OF THE INVENTION

Invention by Government Employee(s) Only

The invention described herein was made by an employee of the United States Government, and may be manufactured and used by or for the Government for governmental purposes without the payment of any royalties thereon or therefor.

BACKGROUND

Field

The aspects of the present disclosure relate generally to space-based processing systems and in particular to mechanically hardened assemblies suitable for use in ground, space, and on-planet applications.

Description of Related Art

Many space-based science missions require "next generation" on-board processing capabilities to meet the specified goals of each mission. These missions use advanced instrumentation systems such as laser altimeter, radar, lidar, and hyper-spectral instruments, which all require advanced on-board processing capabilities to facilitate the timely conversion of earth science data into earth science information. Currently available processing systems do not have the processing power required by these advanced information systems. Both an order of magnitude increase in processing power and the ability to reconfigure on the fly are required to implement algorithms that detect and react to events, to produce data products on-board for applications such as direct downlink, quick look, and "first responder" real-time awareness, to enable sensor web multi-platform collaboration, and to perform on-board lossless data reduction by migrating typical ground-based processing functions on-board, thereby reducing on-board storage and downlink requirements.

The SpaceCube™ system is a Field Programmable Gate Array (FPGA) based, on-board science data processing system, developed at the NASA Goddard Space Flight Center (GSFC). The SpaceCube™ program is an ongoing program with a goal to provide periodic improvements in on-board computing power while lowering relative power consumption and cost. The SpaceCube™ design strategy incorporates commercial rad-tolerant FPGA technology and couples it with an upset mitigation software architecture to provide order of magnitude improvements in computing power over traditional rad-hard flight systems.

Present SpaceCube™ implementations are designed to exceed the processing capability of other radiation tolerant, spaceflight processors. For example, the presently available SpaceCube™ systems are between two to four times smaller than other radiation tolerant, spaceflight processors but have approximately five times the processing power. At least one contributing feature is the mounting of electronic components on an assembly in a back to back mirror image configuration.

However, such a configuration results in an increase in stiffness, mass density, and power dissipation density over local areas of the assembly, which have a significant impact on solder joint fatigue, thermal management, electromagnetic interference, manufacturing and assembly techniques, and the ability to withstand random vibration quasi-static strength tests. As such, traditional mechanical, thermal, electromagnetic shielding, and assembly techniques are not adequate for SpaceCube™ implementations, in particular when used on further reaching, longer duration missions requiring higher reliability. For example, thermal management utilizing heatsinks would disadvantageously result in an increase in size and weight beyond present design parameters. Convective heat transfer would provide inadequate heat transfer and could not be implemented in space. Other passive heat transfer devices, such as phase change materials and gas tight sealed enclosures, and active heat transfer devices, such as thermal electric coolers and pumped liquid coolers, require resources that would hinder achieving the mass, volume, power consumption, costs, and schedule goals of any space program, and in particular SpaceCube™ implementations.

It would be advantageous to implement the SpaceCube™ system in research spacecraft in the nanosatellite class in 3 U configurations, and also in extended 3 U configurations with dimensions that may exceed 100 mm×100 mm×100 mm. Accordingly, it would be desirable to provide a mechanical support system for SpaceCube™ applications that addresses problems with prior art implementations and delivers improved thermal and structural integrity for high power dissipation, complex electronic card assemblies.

BRIEF DESCRIPTION OF THE DISCLOSED EMBODIMENTS

As described herein, the exemplary embodiments overcome one or more of the above or other disadvantages known in the art.

One aspect of the disclosed embodiments relates to an electronic assembly support system including a frame, the frame further including a plurality of side rails side rails to be positioned along a longitudinal axis of an electronic assembly, a plurality of cross rails connected between the side rails, positioned to surround predetermined components of the electronic assembly, and a first fastener interface for attaching the plurality of side rails and cross rails to the electronic assembly;

The electronic assembly support system may include an end plate attached to an end of the first frame perpendicular to a longitudinal axis of the frame, to form an I-beam structure with the frame.

The electronic assembly support system may include a first one of the frame to be attached to a first side of the electronic assembly and a second one of the frame to be attached to a second side of the electronic assembly.

The electronic assembly support system may include flanges extending laterally from each of the side rails to engage with card guides of a card cage.

The electronic assembly support system may further include a heat dissipation mechanism attached to a recessed surface of at least one of the side rails.

The heat dissipation mechanism may comprise a heat pipe.

The electronic assembly support system may include a heat dissipation mechanism attached to recessed surfaces of at least one of the side rails and at least one of the cross rails.

The heat dissipation mechanism may comprise a heat strap.

The frame may further include a second fastener interface on a side of the frame opposite the first fastener interface and the electronic assembly support system may include a shield attached to the second fastener interface.

The frame may include a panel extending between the side rails and the cross rails to form a closed section around one or more components of the electronic assembly.

The electronic assembly support system may include ribs positioned within the closed section between the panel and the one or more components of the electronic assembly and a thermal pad material interposed between the ribs and the one or more components.

Another aspect of the disclosed embodiments relates to a method of supporting an electronic assembly including attaching a frame having a plurality of side rails side rails positioned along a longitudinal axis of an electronic assembly, a plurality of cross rails connected between the side rails, positioned to surround predetermined components of the electronic assembly, and a first fastener interface for attaching the plurality of side rails and cross rails to the electronic assembly.

The method may include attaching an end plate to an end of the frame perpendicular to a longitudinal axis of the frame, to form an I-beam structure with the frame.

The method of claim may include attaching a first one of the frame to a first side of the electronic assembly and attaching a second one of the frame to a second side of the electronic assembly.

The frame may have flanges extending laterally from each of the side rails, and the method may include engaging the flanges with card guides of a card cage.

The method may include attaching a heat pipe to a recessed surface of at least one of the side rails.

The method may include attaching a heat strap to recessed surfaces of at least one of the side rails and at least one of the cross rails.

The frame may have a second fastener interface on a side of the frame opposite the first fastener interface, and the method may include attaching a shield to the second fastener interface.

The method may include providing a panel extending between the side rails and the cross rails to form a closed section around one or more components of the electronic assembly.

The frame may have ribs positioned within the closed section between the panel and the one or more components of the electronic assembly, and the method may include interposing a thermal pad material between the ribs and the one or more components.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

In the drawings:

FIGS. 8A and 8B illustrate another component of the electronic assembly support system in the form of a shield that may be attached to a front side of a frame 815;

FIGS. 9A and 9B depict a top and bottom view of another exemplary embodiment of a frame.

DETAILED DESCRIPTION OF THE DISCLOSED EMBODIMENTS

The disclosed flight system builds on improvements to spaceflight designs made over several years, and is directed to addressing the environmental requirements, flight design rules, and design and assembly features of assemblies suitable for a wide range of applications including on ground, in space, and on-planet applications, and in particular for SpaceCube™ systems.

The disclosed embodiments provide better reliability, meet more stringent environmental requirements, provide a longer life cycle, and accommodate multiple use cases and missions by providing an electronic assembly support system with a set of components that may be assembled in different combinations to meet particular, thermal, vibration, electromagnetic interference (EMI), total dose radiation, or radio-resistance requirements.

The disclosed embodiments may be implemented for, but are not limited, to missions from on Earth to deep space and missions on-planet, that require thermal management and structural integrity not presently available in space processor and power systems. The disclosed embodiments are designed to provide mechanical and thermal integrity for high power dissipation, complex electronic card assemblies, for example, processor and power daughter board configurations, and assemblies mounted in back to back mirror image configurations. Other applicable assemblies may include standard ePCI backplane mountable assemblies. Applications may include research spacecraft, and in particular, research spacecraft having 3 U configurations and utilizing SpaceCube™ systems. The disclosed mechanical frame may be scaled for various power dissipative, structural, vibration, electromagnetic, and radiation use cases.

Figure 1:
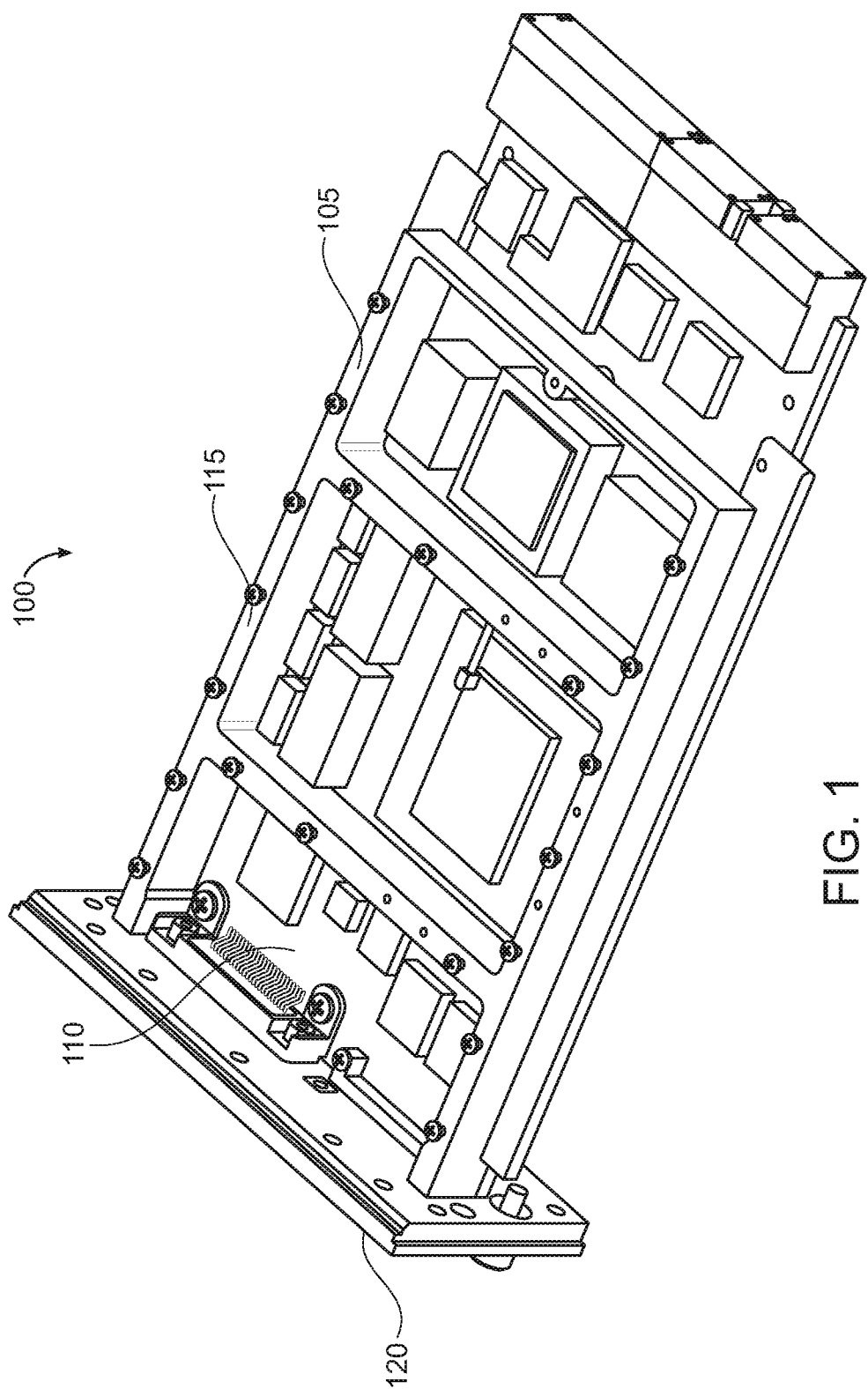
FIG. 1 illustrates an exemplary embodiment of an electronic assembly support system according to the disclosed embodiments.

FIG. 1 shows an exemplary embodiment of an electronic assembly 100 with an exemplary attached support system 105 according to the disclosed embodiments.

The electronic assembly 100 may include one or more printed circuit cards 110, for example, a processing card, a power card, a memory card, and an input/output (I/O) card, that include electronic components mounted on a printed circuit board, for example, in a back to back, mirror image configuration. A typical processing card may include a number of flash memory devices which provide general and mission specific processing capabilities, and may be electrically re-programmed while in the system to provide on the fly reconfiguration capabilities. An exemplary power card may provide power for consumption by the other cards. A memory card may provide non-volatile data storage which may be used to store programs for operating the processor and data from other assemblies, such as data from experiments, scientific instruments, control circuitry and communication circuitry. An I/O card may generally provide an interface to other assemblies, which may include the experiments, scientific instruments, control circuitry and communication circuitry. The electronic assembly 100 may include one or more other cards and card assemblies, for example, a LiDAR card, a GPS card, and a robotics driver card.

The electronic assembly support system 105 may include a frame 115 and an endplate 120 to which the frame 115 is attached.

Figure 2A:
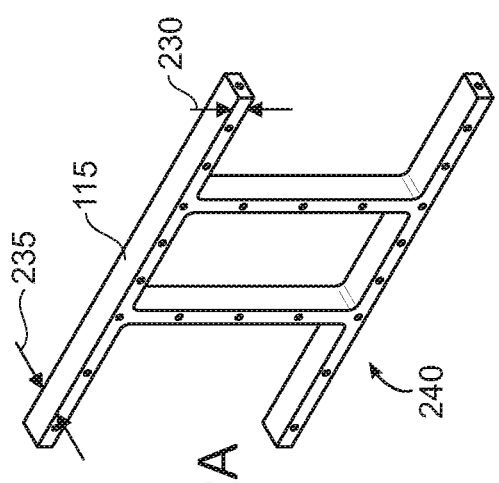
FIGS. 2A and 2B illustrate a front view and a rear view, respectively, of an exemplary embodiment of a frame according to the disclosed embodiments.
Figure 2B:
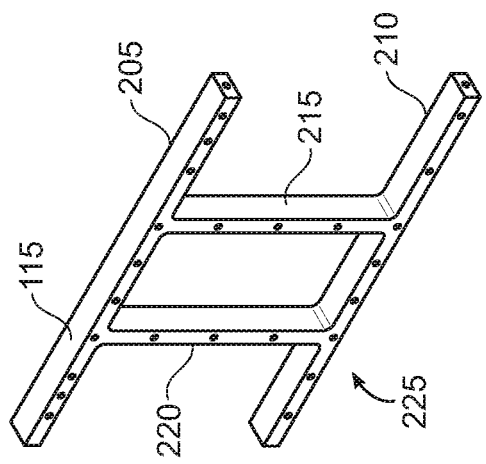

FIGS. 2A and 2B illustrate a front view and a rear view, respectively, of an exemplary embodiment of the frame 115. Referring to FIG. 2B, the frame 115 may include two or more side rails 205, 210 and two or more cross rails 215, 220 interconnecting the side rails 205, 210. The side rails 205, 210 may be positioned along a longitudinal axis of the electronic assembly 100 and the cross rails 215, 220 may be connected between the side rails at right angles. The frame 115 may be made of a precipitation hardened aluminium alloy material that remains resistant to corrosion even when abraded, for example, AI 6061. Other suitable materials may also be used.

The frame 115 may also include an interface 225 to the electronic assembly 100 that may be common for electronic assemblies with various power requirements. For example, the interface 225 may be a fastener interface that may include fasteners for attaching the frame to the electronic assembly, or may include receptacles for accepting fasteners used to fasten the frame 115 to the electronic assembly 100. Fastener interface spacing on the frame 115 may correspond to spacing on the electronic assembly 100. Fastener interface spacing was determined empirically to meet power dissipation requirements of the electronic assembly along with thermal (NASA-STD-5001), mechanical (NASA-STD-5002, environmental (GSFC-STD-7000, MIL-STD-461), reliability (IPC 6012 class 3A), random vibration (14.1 GRMS profile for two minutes per axis), and quasi-static strength (40G acceleration in 3 axes) tests. Fastener spacing was also determined empirically to reduce radiated emissions, for example, for gigahertz speed electronic components, while at the same time limiting the volume, mass, and assembly area covered by the frame 115.

In at least one embodiment, a fastener spacing of nominally one inch meets the requirements described herein. In some embodiments, the fasteners may be bolts and the fastener interface 225 may include threaded holes for accepting the bolts.

The location of components on the electronic assembly 100 and the spacing of the cross rails 215, 220 may be coordinated such that the cross rails 215, 220 surround components of the electronic assembly 100 that may have specific requirements, for example thermal, vibration, EMI, total dose radiation, or radio-resistance requirements. In at least one embodiment, the cross rails 215, 220 are placed such that the frame 115 surrounds various processor, voltage converter, and memory components in order to reduce local deflection of the components and the printed circuit boards, reduce their susceptibility to vibration fatigue, dissipate heat, and protect against radiation and interference.

Referring to the front view 2A, while the overall width and height of the frame 115 may be determined by the size of the electronic assembly 100, the width 230 and height 235 of the side rails 205, 210 and cross rails 215, 220 were determined empirically to meet component height clearance requirements and the power dissipation, thermal, mechanical, environmental, reliability, random vibration, and quasi-static strength tests mentioned above. In one or more embodiments, the width 230 of the side rails 205, 210 and cross rails 215, 220 may be 0.25 inches and the height 235 of the side rails 205, 210 and cross rails 215, 220 may be 0.50 inches.

Still referring to the front view 2A, the front of the frame may also include a fastener interface 240 may include fasteners for attaching additional components to the front side of the frame 115, or may include receptacles for accepting fasteners used to fasten additional components to the front side of the frame.

Figure 3A:
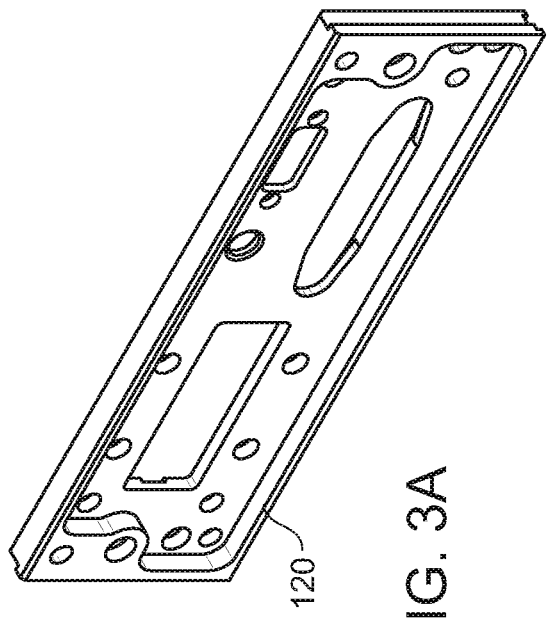
FIGS. 3A and 3B show a front and rear view of an endplate to which a frame may be attached.
Figure 3B:
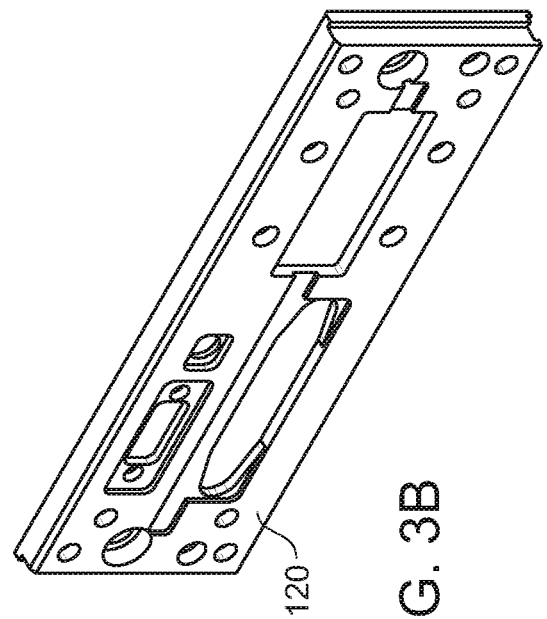

FIGS. 3A and 3B show a front and rear view of the endplate 120 to which the frame 115 may be attached. The endplate 120 may be positioned perpendicular to a longitudinal axis of the frame 115 and may attached using any suitable fasteners or fastening technique, to form an I-beam structure with the frame 115. The addition of the endplate 120 reduces the susceptibility of the electronic assembly 100 to vibration fatigue, in particular to solder joint vibration fatigue. The endplate 120 may also act as a heat sink to dissipate heat from the electronic assembly and may further provide increased vibration, EMI, total dose radiation, or radio-resistance characteristics.

Figure 4B:
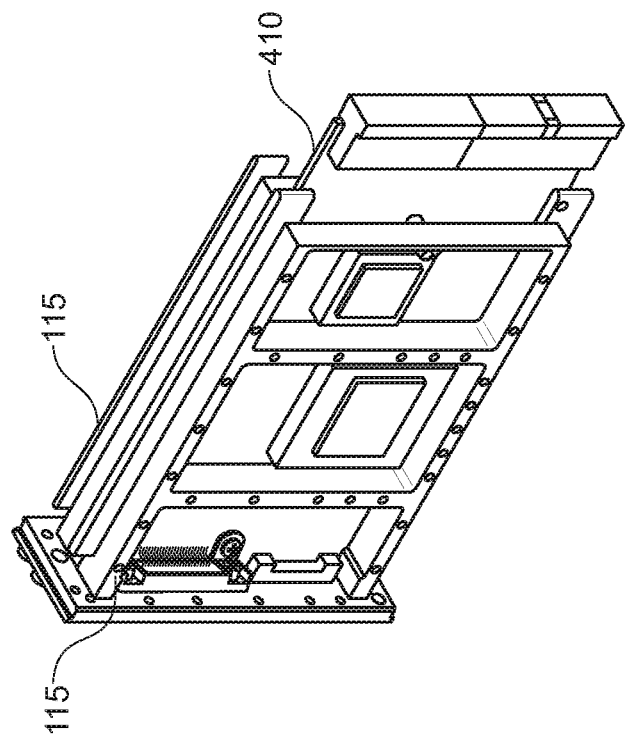
FIG. 4B shows an electronic assembly utilizing dual frames.
Figure 4A:
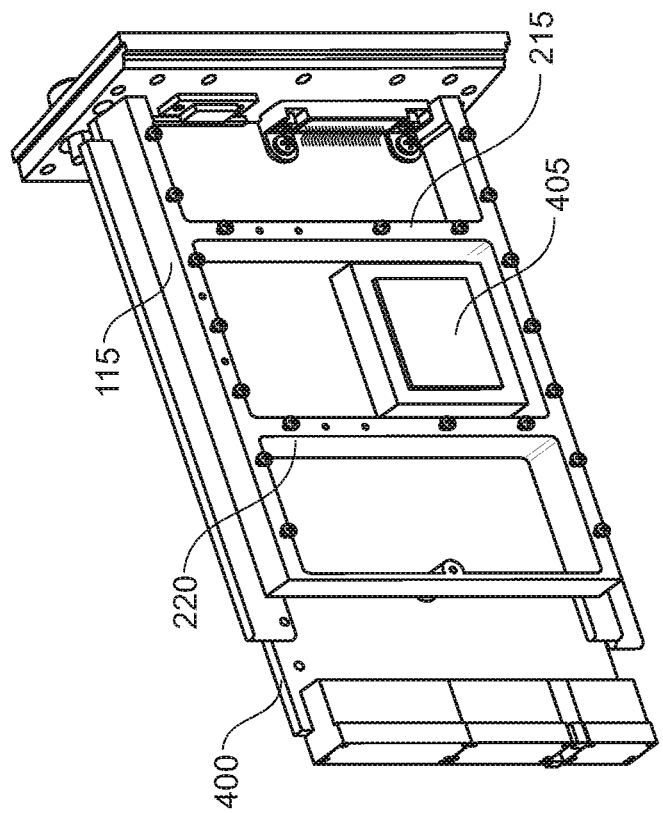
FIG. 4A shows an embodiment utilizing a single frame on one side of an electronic assembly.

FIG. 4A shows an embodiment utilizing a single frame 115 on one side of an electronic assembly 400. The spacing of the cross rails 215, 220 may correspond to the width of an electronic component 405 that may require heatsinking. FIG. 4B shows an electronic assembly 410 utilizing dual frames 115, fastened to both sides of an electronic assembly 410. The additional frame may be attached to increase the heat dissipation capability, EMI resistance, total dose radiation, and radio-resistance of the electronic assembly 410.

Figure 5A:
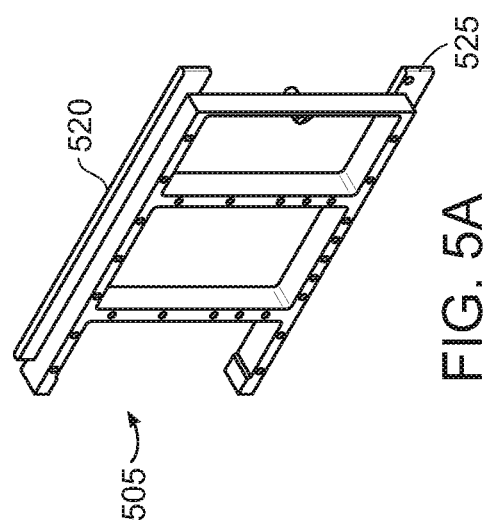
FIG. 5A illustrates a further embodiment of a frame that includes flanges.
Figure 5B:
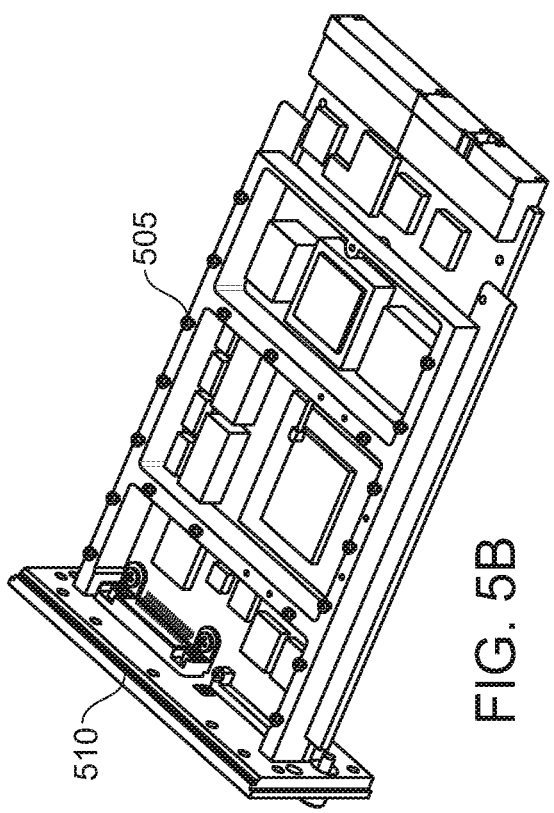
FIG. 5B shows an electronic assembly utilizing a single flanged frame'
Figure 5C:
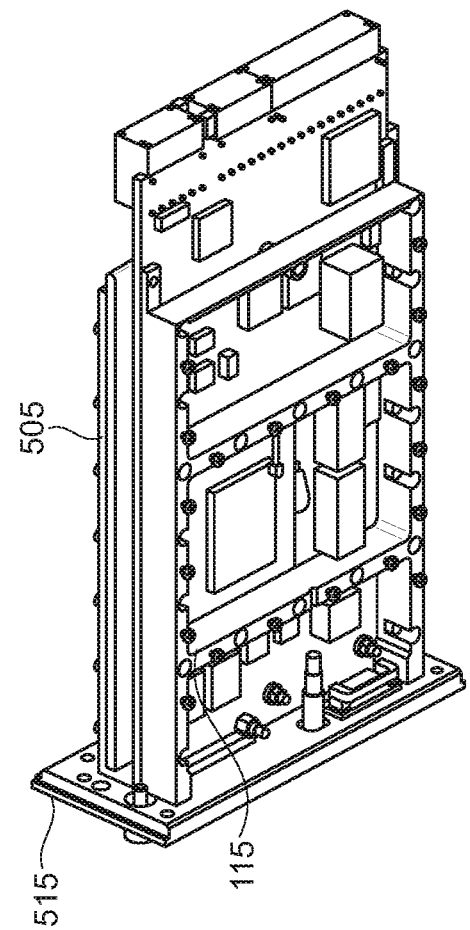
FIG. 5C shows an electronic assembly utilizing dual frames.

FIG. 5A illustrates a further embodiment of the frame 505 that includes flanges 520, 525 extending laterally from the side rails in order to engage with a card guide to allow for the electronic assembly to be inserted into and extracted from a card cage. The flanges 320, 325 may provide thermal, mechanical, and electrical coupling to the card cage, and additional stiffness and heat dissipation capabilities to the frame 505, over and above embodiments without the flanges. FIG. 5B shows an electronic assembly 510 utilizing a single flanged frame 505 on one side of an electronic assembly 400. FIG. 5C shows an electronic assembly 515 utilizing dual frames fastened to both sides of an electronic assembly 520. In this embodiment, the electronic assembly utilizes a flanged frame 515 on one side, and a frame 115 without flanges on an opposing side.

Figure 6B:
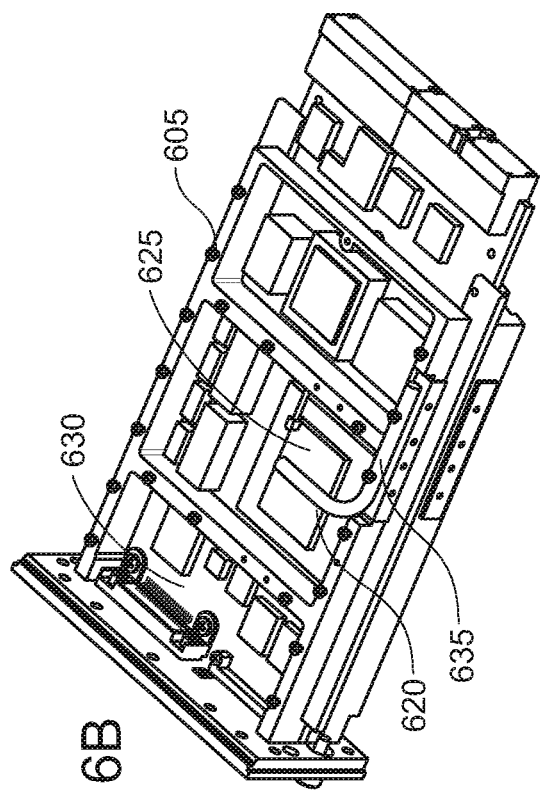
FIG. 6B shows an embodiment where the heat dissipation mechanism is a heat pipe.
Figure 6A:
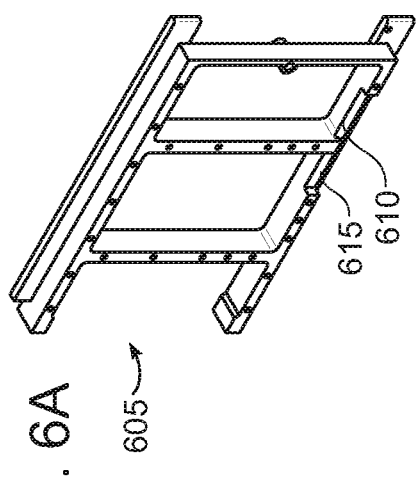
FIG. 6A shows an exemplary frame with a mounting surface for a heat dissipation mechanism.

FIG. 6A shows an exemplary frame 605 with a mounting surface 610 positioned on at least one side rail 205, 210 for a heat dissipation mechanism for providing further heat dissipation capability, for example, a heat pipe 620 (FIG. 6B). The mounting surface 610 may be recessed and may include a fastener interface 615 for attaching the heat dissipation mechanism. As shown in FIG. 6B, the heat pipe 620 may include a pad 625 that may be attached or otherwise provided in thermal contact with an electronic component on the electronic assembly 630, and a heat conductor 635 that may have a portion fastened to the mounting surface 610 for conducting heat from the pad to the frame 605.

Figure 7B:
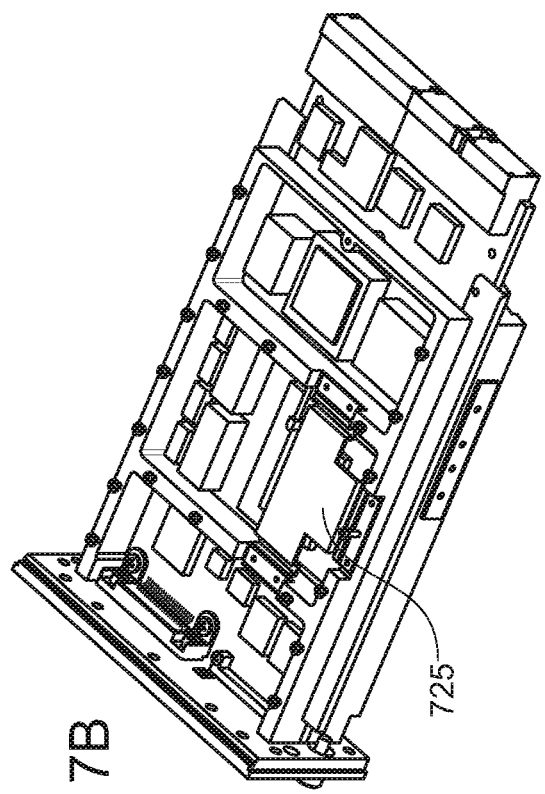
FIG. 7B shows an embodiment where the differently configured heat dissipation mechanism is a heat strap.
Figure 7A:
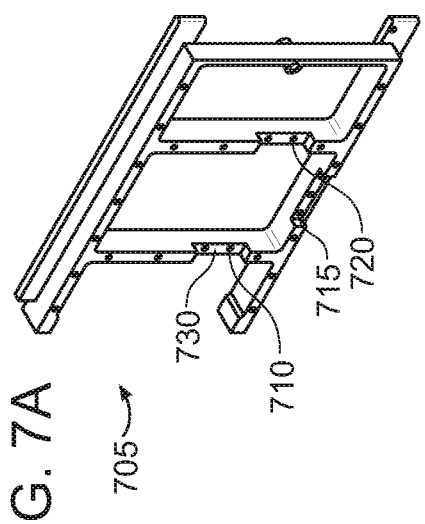
FIG. 7A shows an exemplary frame with mounting surfaces for mounting a differently configured heat dissipation mechanism.

FIG. 7A shows an exemplary frame 705 with mounting surfaces 710, 715, 720 for mounting a differently configured heat dissipation mechanism, for example, a heat strap 725 (FIG. 7B). The mounting surfaces 710, 715, 720 may be positioned to support multiple sides of the heat strap 725, may be recessed, and may each include a fastener interface 730. As shown in FIG. 7B, the heat strap 725 may include a planar sheet of thermally conductive material with extensions extending onto, and fastened to, mounting surfaces 710, 715, 720.

FIGS. 8A and 8B illustrate another component of the electronic assembly support system 105 in the form of a shield 805 that may be attached to a front side 810 of the frame 815. The shield 805 may be attached to a front side 810 of the frame 815 using the fastener interface 240 (FIG. 2A). The shield 805 may be symmetrical and may provide increased vibration resistance, increased EMI shielding, increased total dose radiation protection, increased or radio-resistance requirements, and may further provide increased thermal dissipation through the frame 815. The shield may also be positioned over components of the electronic assembly 100 that may have specific requirements, for example thermal, vibration, EMI, total dose radiation, or radio-resistance requirements. Increased thermal dissipation and vibration resistance may be further enhanced by the use of a pad of thermally conductive material, described below, that may be interposed between the shield 805 and components of the electronic assembly 100 that may have specific requirements thermal and vibration requirements.

FIGS. 9A and 9B depict a top and bottom view of another exemplary embodiment of the frame 905. The frame 905 includes a section 910 closed by a panel 915 extending between the side rails 205, 210 and the cross rails 215, 220. The panel 915 may provide additional stiffness, EMI shielding, total dose radiation protection, and additional heat dissipation for components enclosed by the closed section 910. The closed section 910 may further include one or more ribs 920, positioned to cover the enclosed components to enhance the stiffness, EMI shielding, total dose radiation protection, and heat dissipation. Thermal dissipation and vibration resistance may be further enhanced by the use of a pad of thermally conductive material, described below, that may be interposed between the ribs 920 and various components within the closed section 910.

Figure 10:
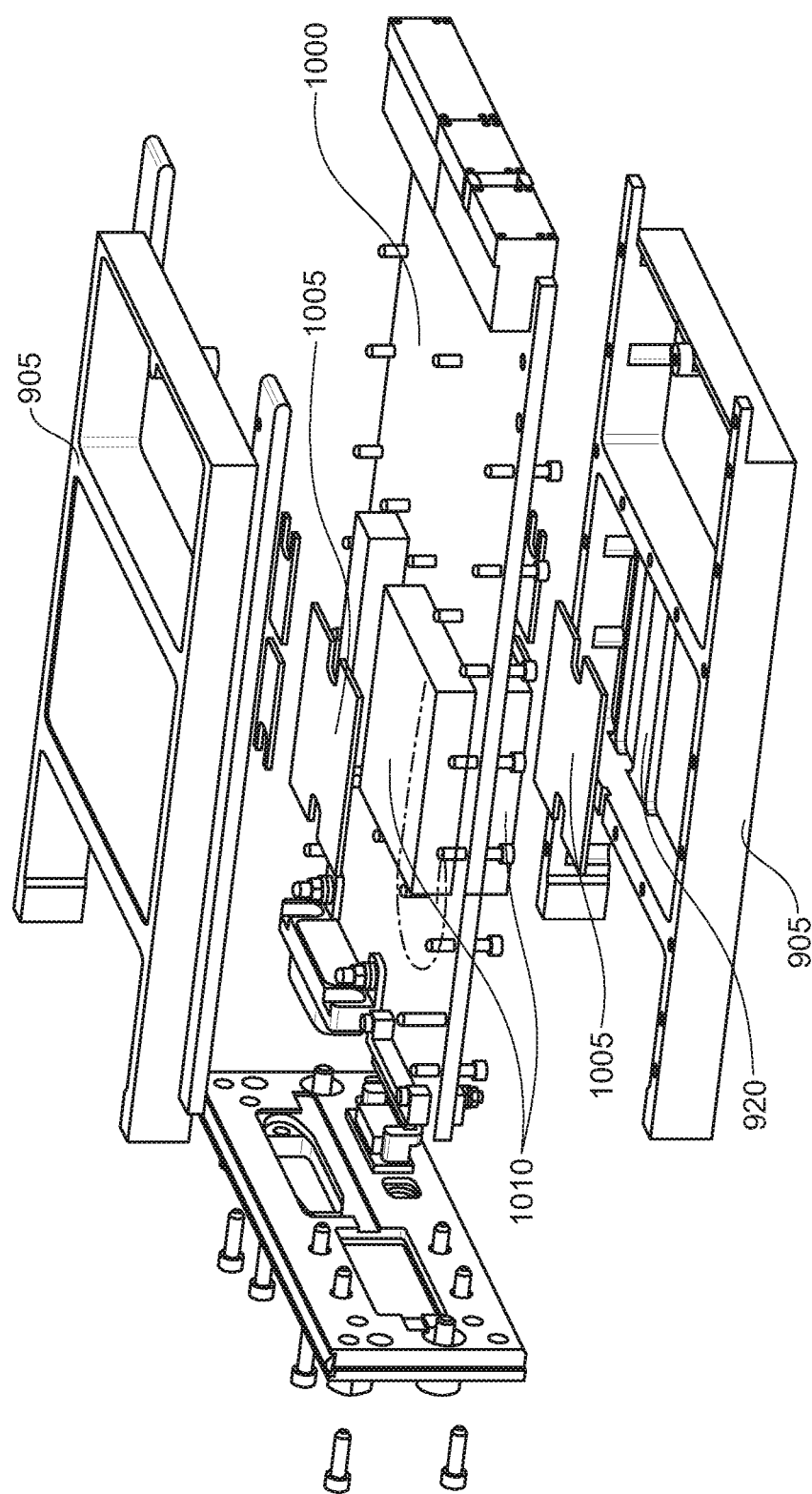
FIG. 10 shows an exploded view of an embodiment incorporating dual frames.

FIG. 10 shows an exploded view of an embodiment incorporating dual frames 905, attached to opposing sides of an electronic assembly 1000. A pad of thermally conductive material 1005 may be positioned between certain electronic components 101 of the electronic assembly and one or more ribs 920 of the frame 905 in order to enhance thermal dissipation and vibration resistance. The thermally conductive material may be selected to have reduced outgassing and creep characteristics when subjected to the thermal, mechanical, environmental, reliability, random vibration, and strength tests set out above.

Thus, the disclosed embodiments provide an electronic assembly support system with a set of components that may be assembled in different combinations to meet particular, thermal, vibration, electromagnetic interference (EMI), total dose radiation, or radio-resistance requirements.

Furthermore, while there have been shown, described and pointed out, fundamental novel features of the invention as applied to the exemplary embodiments thereof, it will be understood that various omissions and substitutions and changes in the form and details of devices and methods illustrated, and in their operation, may be made by those skilled in the art without departing from the spirit and scope of the invention. Moreover, it is expressly intended that all combinations of those elements, which perform substantially the same function in substantially the same way to achieve the same result, are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An electronic assembly support system for a space-based processing system satisfying thermal dissipation, vibration, EMI/EMC, and radiation requirements, the electronic assembly support system comprising:
    a frame, the frame comprising:
        a plurality of side rails side rails to be positioned along a longitudinal axis of an electronic assembly;
        a plurality of cross rails connected between the side rails, positioned to surround predetermined components of the electronic assembly; and
        a first fastener interface for attaching the plurality of side rails and cross rails to the electronic assembly; and
        an end plate attached to an end of the first frame perpendicular to a longitudinal axis of the frame, to form an I-beam structure with the frame.

2. The electronic assembly support system of claim 1, the electronic assembly support system further comprising a first one of the frame to be attached to a first side of the electronic assembly and a second one of the frame to be attached to a second side of the electronic assembly.

3. The electronic assembly support system of claim 1, the electronic assembly support system further comprising flanges extending laterally from each of the side rails to engage with card guides of a card cage.

4. The electronic assembly support system of claim 1, the electronic assembly support system further comprising a heat dissipation mechanism attached to a recessed surface of at least one of the side rails.

5. The electronic assembly support system of claim 4, wherein the heat dissipation mechanism comprises a heat pipe.

6. The electronic assembly support system of claim 1, the electronic assembly support system further comprising a heat dissipation mechanism attached to recessed surfaces of at least one of the side rails and at least one of the cross rails.

7. The electronic assembly support system of claim 6, wherein the heat dissipation mechanism comprises a heat strap.

8. The electronic assembly support system of claim 1, wherein the frame further comprises a second fastener interface on a side of the frame opposite the first fastener interface, the electronic assembly support system further comprising a shield attached to the second fastener interface.

9. The electronic assembly support system of claim 1, wherein the frame comprises a panel extending between the side rails and the cross rails to form a closed section around one or more components of the electronic assembly.

10. The electronic assembly support system of claim 9, the electronic assembly support system further comprising:
ribs positioned within the closed section between the panel and the one or more components of the electronic assembly; and
a thermal pad material interposed between the ribs and the one or more components.

11. A method of supporting an electronic assembly for a space-based processing system satisfying thermal dissipation, vibration, EMI/EMC, and radiation requirements, the method comprising:
attaching a frame, the frame comprising:
a plurality of side rails side rails positioned along a longitudinal axis of an electronic assembly;
a plurality of cross rails connected between the side rails, positioned to surround predetermined components of the electronic assembly; and
a first fastener interface for attaching the plurality of side rails and cross rails to the electronic assembly; and
attaching an end plate to an end of the frame perpendicular to a longitudinal axis of the frame, to form an I-beam structure with the frame.

12. The method of claim 11, the method further comprising attaching a first one of the frame to a first side of the electronic assembly and attaching a second one of the frame to a second side of the electronic assembly.

13. The method of claim 11, wherein the frame comprises flanges extending laterally from each of the side rails, the method further comprising engaging the flanges with card guides of a card cage.

14. The method of claim 11, the method further comprising attaching a heat pipe to a recessed surface of at least one of the side rails.

15. The method of claim 11, the method further comprising attaching a heat strap to recessed surfaces of at least one of the side rails and at least one of the cross rails.

16. The method of claim 11, wherein the frame comprises a second fastener interface on a side of the frame opposite the first fastener interface, the method further comprising attaching a shield to the second fastener interface.

17. The method of claim 11, the method further comprising providing a panel extending between the side rails and the cross rails to form a closed section around one or more components of the electronic assembly.

18. The method of claim 17, wherein the frame comprises ribs positioned within the closed section between the panel and the one or more components of the electronic assembly, the method further comprising interposing a thermal pad material between the ribs and the one or more components.

* * * * *